United States Patent
Summers et al.

[11] Patent Number: 5,822,193
[45] Date of Patent: Oct. 13, 1998

[54] APPPARATUS AND METHOD FOR RIGIDLY STABILIZING CIRCUIT BOARDS

[75] Inventors: Mark David Summers, Phoenix; Ronald Newell Hamilton; Frederick Conrad Ehorn, both of Mesa; Brian Mitchel Cover, Gilbert, all of Ariz.

[73] Assignee: Motorola, Inc., Schaumburg, Ill.

[21] Appl. No.: 868,439

[22] Filed: Jun. 3, 1997

[51] Int. Cl.⁶ .................................................. H05K 7/14
[52] U.S. Cl. .......................... 361/759; 361/801; 361/802; 361/740; 361/741; 361/756; 361/785; 439/59; 439/62; 439/64; 439/636; 439/637
[58] Field of Search .................... 361/759, 801, 361/802, 740, 741, 756, 785; 439/59, 62, 64, 325, 327, 328, 377, 636, 637

[56] References Cited

U.S. PATENT DOCUMENTS

| | | | |
|---|---|---|---|
| 5,317,483 | 5/1994 | Swindler | 361/801 |
| 5,383,793 | 1/1995 | Hsu et al. | 361/759 |
| 5,398,164 | 3/1995 | Goodman et al. | 361/752 |
| 5,544,006 | 8/1996 | Radloff et al. | 361/683 |
| 5,642,263 | 6/1997 | Lauruhn | 361/801 |
| 5,650,917 | 7/1997 | Hsu | 361/759 |
| 5,708,563 | 1/1998 | Cranston, III et al. | 361/683 |
| 5,715,146 | 2/1998 | Hoppal | 361/796 |

*Primary Examiner*—Leo P. Picard
*Assistant Examiner*—David Foster
*Attorney, Agent, or Firm*—Frank J. Bogacz

[57] ABSTRACT

An apparatus and method for rigidly stabilizing or restraining circuit boards is provided. The apparatus has a rigid cross member (20) and a circuit board clamp (10). These provides stabilization of commercial off the shelf (COTS) circuit boards for use in harsh environments. A one piece clamp has hooks with notched ends that attach to opposite sides of each circuit board. The clamp has a surface parallel to the hook. The parallel surface has threaded holes. Threaded shafts are used with the threaded holes to contact the clamp hook and provide pressure on the printed circuit board. A threaded hole is used with a threaded shaft to engage a rigid cross member. The cross member has unthreaded holes to allow for attaching to the clamps with threaded fasteners. The rigid cross member is then attached to the chassis with a fastener. This eliminates flexing of the circuit board under vibration.

18 Claims, 4 Drawing Sheets

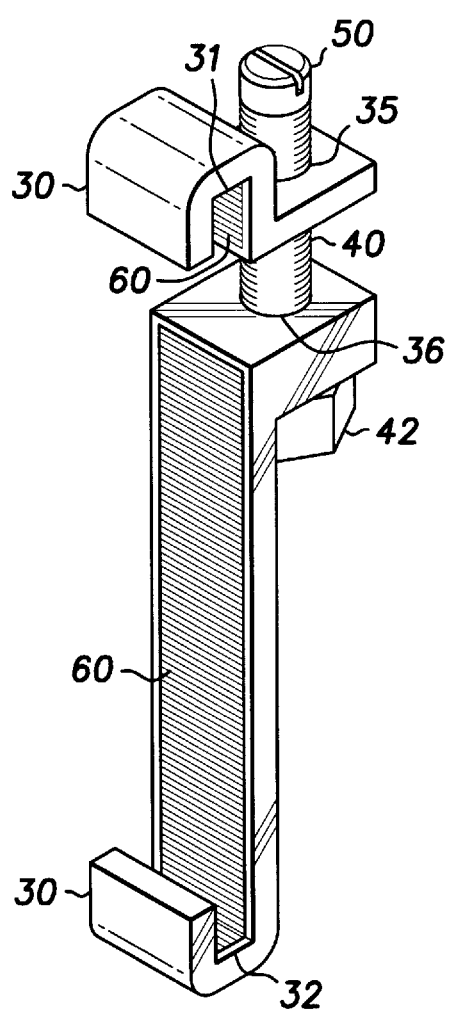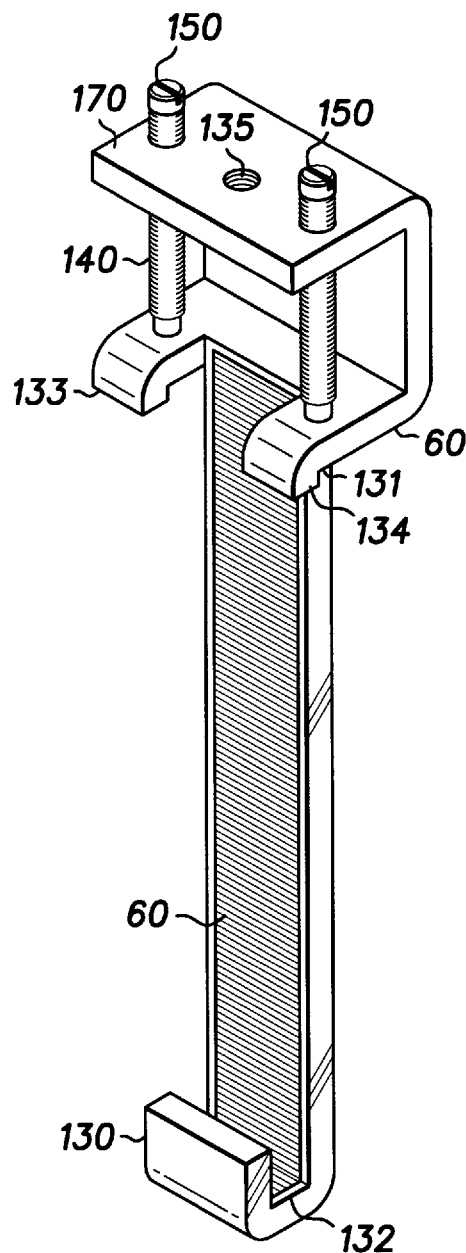

APPPARATUS AND METHOD FOR RIGIDLY STABILIZING CIRCUIT BOARDS

BACKGROUND OF THE INVENTION

The present invention pertains to circuit boards and more particularly to rigidly stabilizing a circuit board for operation in rugged environments.

Modern electronics for the military and for other rugged applications are being designed with 'plug and play' printed circuit boards. These commercial off the shelf (COTS) printed circuit boards are being used in a variety of computer applications. Included, for example, are printed circuit boards for personal computers (PC) such as peripheral component interconnect (PCI) printed circuit boards and industry standard architecture (ISA) printed circuit boards, etc. The majority of COTS computer printed circuit boards are for PC applications where the printed circuit boards are mounted in a chassis.

The PC printed circuit boards have inherent problems in packaging for rugged environments. First, the printed circuit boards are typically long and mounted with edge connectors at the long end of the printed circuit boards. This results in rigid body motion problems and severe connector loading.

Thus there is a problem of vibration and associated deflections along the card length. A poorly restrained board will often deflect under the influence of typical shock and vibration loadings found in rugged environments. This deflection could effect the components on the card, the grounding to the chassis and the edge card connection.

Present state of the art circuit boards are only rigidly restrained at one or both ends of the printed circuit board. Deflection of the typical printed circuit board can be extensive.

The most deflection occurs in the middle of the printed circuit board and at the board natural frequencies modes. The greatest deflection is at the first natural frequency mode, which is usually at about 100 Hz. The frequency and amplitude of the deflection varies with the printed circuit board parameters.

The printed circuit board length, rigidity, weight and the placement of components and printed circuits on the board effect the natural frequency and displacement under vibration. Any conformal coating applied to the printed circuit will also effect the displacement. Typical PC COTS circuit boards are quite long, which contributes to their susceptibility to vibration.

If unrestrained, the printed circuit board can fatigue and fail, printed circuits can separate from the board, grounding to the chassis can become intermittent, and electronic components can come loose.

The circuit board restraint should eliminate vibration movement when the equipment is transported by a surface vehicle, aircraft or when located on any vibrating platform. Any vibration restraint of the circuit boards in the PC chassis should be such that boards can be readily replaced or repaired during manufacture. Also the circuit boards may need to be replaced as upgrades occur or as field repairs need to be made.

Accordingly, it would be advantageous to have a replaceable arrangement to rigidly stabilize commercial off the shelf (COTS) personal computer PC printed circuit boards and eliminate problems with vibration in harsh environments. Included is the need to eliminating the majority of the rigid body motion to reduce the loading on the printed circuit board edge connector, enhance grounding, plus decrease strain on the printed circuit board and associated components mounted on it.

BRIEF DESCRIPTION OF THE DRAWINGS

FIG. 2 is an isometric view that illustrates one type of two piece printed circuit board clamp to interface between a printed circuit board and a rigid cross member in accordance with the present invention.

FIG. 4 is an isometric view that illustrates one type of a one piece printed circuit board clamp to interface between a printed circuit board and a rigid cross member in accordance with the present invention.

DESCRIPTION OF THE PREFERRED EMBODIMENT

In accordance with the present invention, an apparatus to rigidly stabilize or restrain circuit boards is presented. More particularly, the rigid cross member is for stabilizing commercial off the shelf (COTS) personal computer (PC) printed circuit boards.

Figure 1:
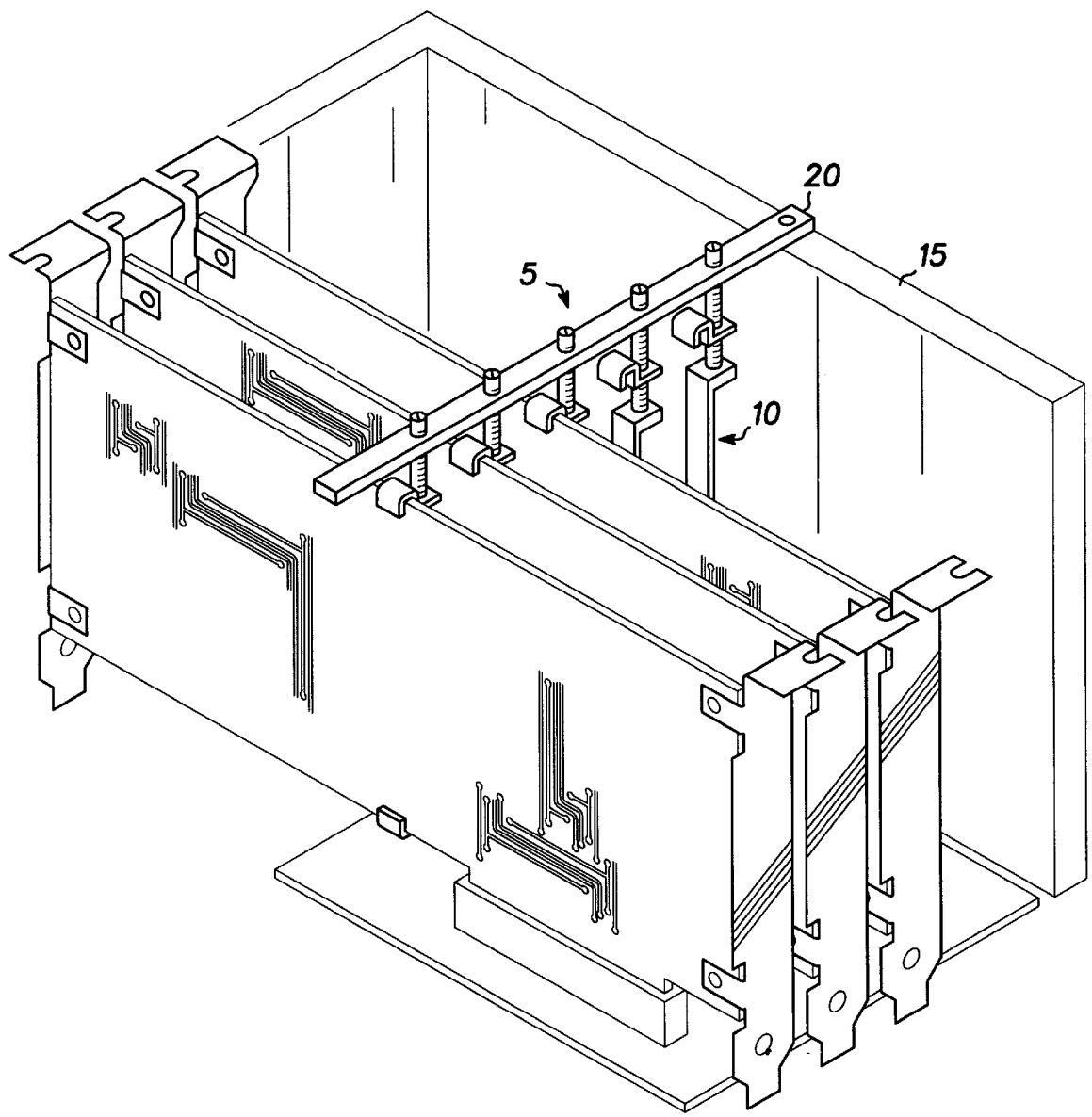
FIG. 1 is an isometric view showing a rigid cross member and a printed circuit board clamp in accordance with the present invention.

Referring to FIG. 1, an apparatus 5 to rigidly stabilize a printed circuit board is shown for installation in a personal computer chassis 15. The apparatus 5 uses a rigid cross member 20 secured to the equipment chassis in conjunction with a readily removable printed circuit board clamp 10 as shown in FIG. 1.

The rigid cross member 20 provides stabilization for a plurality of printed circuit boards (PCB) such as personal computer (PC) boards while still allowing for ready replacement of boards. Further rigidity can be obtained by coupling the cross member at both ends with the chassis.

Referring to FIG. 2, an embodiment of a two piece version of a printed circuit board clamp 10 is shown. Slotted or notched ends 31 and 32 on each of the printed circuit board clamp hooks 30 capture or attach to opposite sides of each of the circuit boards.

These can be commercial off the shelf (COTS) personal computer (PC) boards. The upper printed circuit board clamp hook has a threaded hole 35. The lower circuit board clamp hook includes an unthreaded hole 36. A threaded shaft 40 with a cap 42 is mounted through the unthreaded hole 36 and threaded through the threaded hole 35. Cap 42 prevents shaft 40 from pulling through unthreaded hole 36 when shaft 40 is tightened.

When the threaded shaft is turned, the upper and lower circuit board clamp hooks tightly engage the opposite sides of the circuit board. The end of this threaded shaft can have a slot 50 for tightening by a tool such as a screwdriver.

A dielectric coat 60 is applied for electrical isolation of the printed circuit board clamp 10 from the printed circuit board electronics as well as from the personal computer chassis.

Figure 3:
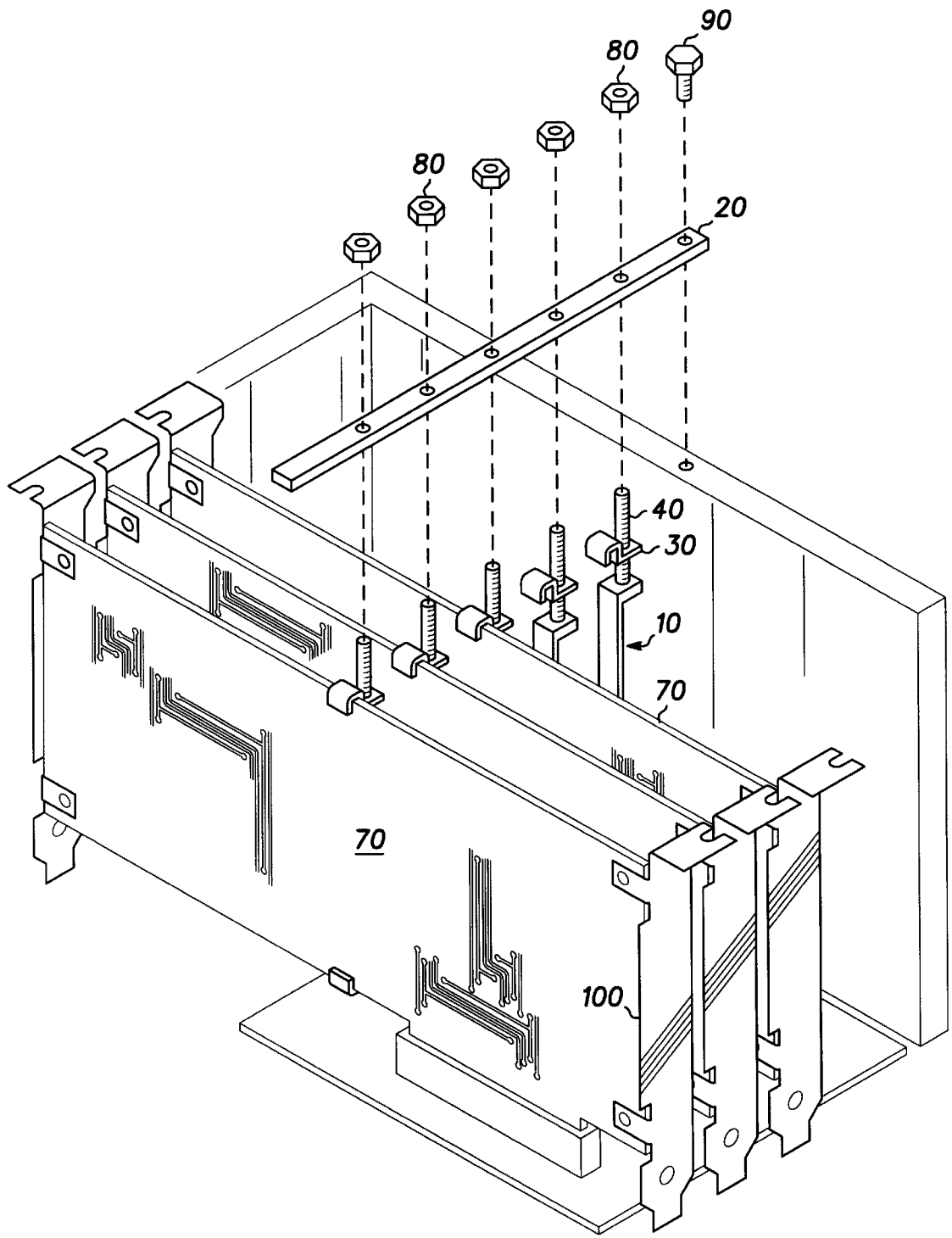
FIG. 3 is an isometric view of connecting together a two piece printed circuit board clamp, a rigid cross member and a chassis in accordance with the present invention.

Referring to FIG. 3, a rigid cross member 20 with unthreaded holes allows for attaching to a threaded shaft 40 of printed circuit board clamp 10 with threaded fastener 80. The rigid cross member 20 is then attached to the chassis with a bolt 90 as shown in FIG. 3 or a similar fastener through an unthreaded hole or by welding or by some other type of adhesives.

Referring to FIG. 4, a preferred embodiment having a one piece circuit board clamp 110 is shown. Slotted or notched ends 131 and 132 on each of the printed circuit board clamp hooks 130, 133 and 134 capture or attach to opposite sides of each of the circuit boards. The one piece clamp has a surface 170 substantially parallel to the hook. The parallel surface has three threaded holes 135.

A threaded shaft 140 is used with the outer threaded holes 135 to contact the printed circuit board clamp hooks 133 and 134 to apply pressure on the hooks. A slot 150 in the threaded shaft 140 is tightened to apply pressure to the hooks 133 and 134 to rigidly engage a circuit board against hook 130. The center threaded hole 135 is used with a threaded shaft 140 to engage the rigid cross member 20.

The one piece circuit board clamp 110 could be also fabricated similar to the circuit board clamp 10 by having only one threaded hole and one threaded shaft to engage the rigid cross member. The one piece circuit board clamp 110 could also have more than two holes and threaded shafts to broaden the area engaged.

The one piece circuit board clamp 110 shown in FIG. 4 is a preferred embodiment, since it can be readily fabricated from a single piece of material without many manufacturing steps. A dielectric coat 60 is applied to the one piece circuit board clamp 110 by dipping the clamp into a suitable dielectric material such as a polymer or non-organic insulation coating.

Figure 5:
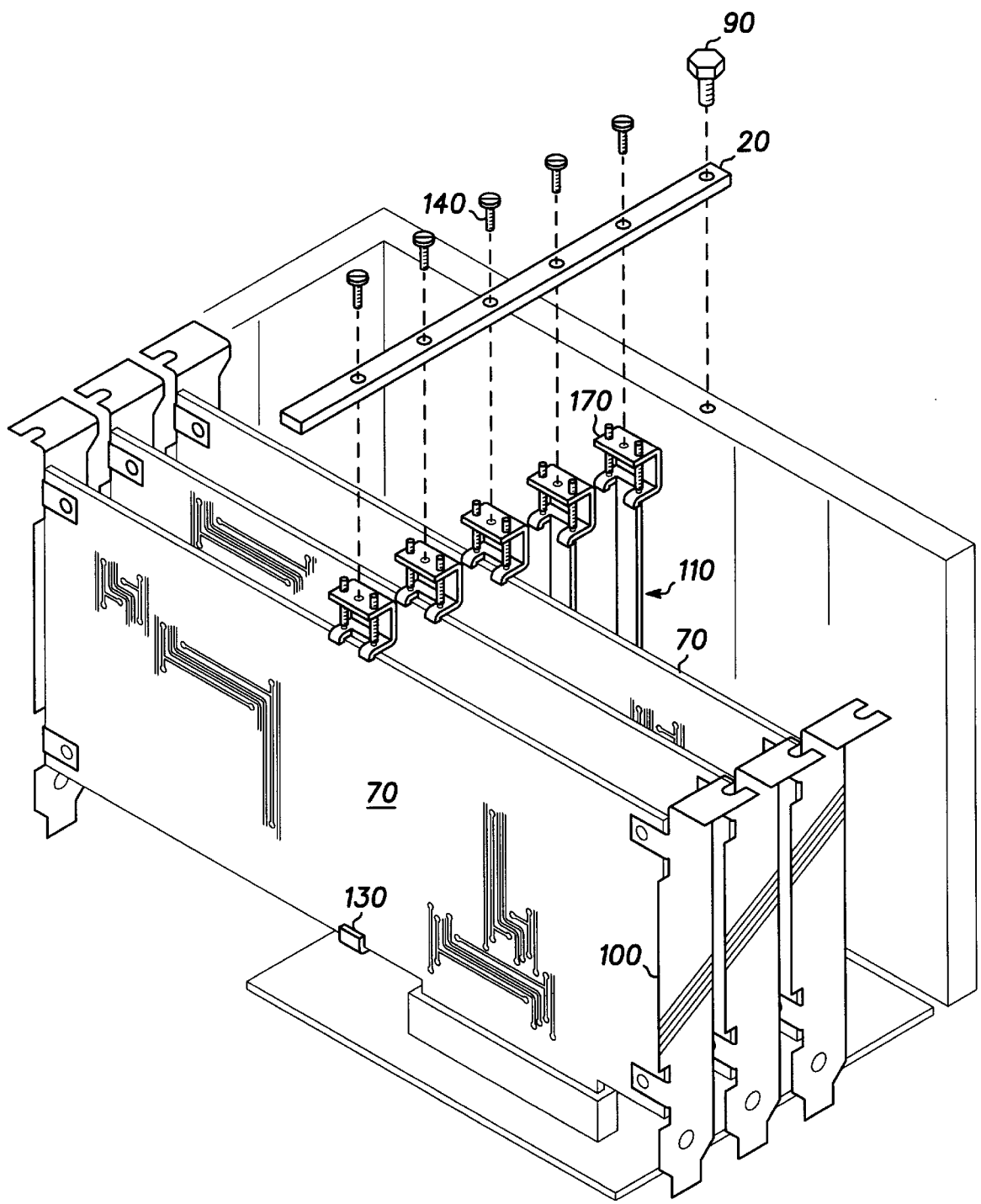
FIG. 5 is an isometric view of the connecting of a one piece printed circuit board clamp, a rigid cross member and a chassis in accordance with the present invention.

Referring to FIG. 5, the printed circuit board clamps 110 are shown clamping commercial off the shelf (COTS) printed circuit boards 70 such as peripheral component interconnect (PCI) printed circuit boards and industry standard architecture (ISA) printed circuit boards, etc.

The threaded shaft 140 is inserted through the unthreaded hole in the rigid cross member 20 and into the center threaded hole 135 in the surface 170. The threaded shaft 140 is tightened to couple the rigid cross member 20 and the circuit board clamp 110. The rigid cross member 20, when added to several printed circuit boards, will provide a considerable increase in circuit board stabilization of each circuit board.

Further stabilization will be obtained when coupled together with a fastener to the computer chassis. The rigid mount will reduce the majority of problems due to deflection or "oil canning" with operation of personal computers in harsh or military environments. Additional rigidity can be obtained by attaching the rigid cross member 20 at both ends to the PC chassis with fasteners 90. This further increases the elimination of rigid body motion.

The rigid cross member thus provides the desired snubbing and damping of the COTS PC board motion. The rigid cross member 20 also reduces rigid body loading on an edge card connector 100 shown in FIG. 5. This can further enhance grounding of the circuitry.

Commercial off the shelf (COTS) personal computer boards can therefore be packaged for rugged environments such as military applications, for shipping and handling protection, or for computer use by younger children.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. An apparatus for stabilizing a circuit board comprising:
   a circuit board clamp for attaching to the circuit board;
   a cross member for attaching to said circuit board clamp; and
   said cross member further attaching to a chassis.

2. An apparatus for stabilizing said circuit board as claimed in claim 1 wherein said circuit board is a printed circuit board:
   said circuit board is a commercial off the shelf (COTS) circuit board; and
   said commercial off the shelf (COTS) circuit board is for a personal computer.

3. An apparatus for stabilizing said circuit board as claimed in claim 1 wherein said circuit board clamp includes a one piece circuit board clamp with two hooks for attaching to opposite sides of said circuit board.

4. An apparatus for stabilizing said circuit board as claimed in claim 3 wherein said one piece circuit board clamp includes:
   a first and second hook;
   said second hook being opposite said first hook;
   a surface substantially parallel to said second hook;
   a threaded hole through the surface substantially parallel to said second hook;
   a threaded shaft for contacting the second hook and applying pressure; and
   the second hook engaging the circuit board and securely holding the circuit board between the first and second hooks.

5. An apparatus for stabilizing said circuit board as claimed in claim 4 wherein said one piece circuit board clamp include a plurality of said threaded shafts for applying pressure to the second hook.

6. An apparatus for stabilizing said circuit board as claimed in claim 5 wherein said one piece circuit board clamp includes a dielectric coating to provide electrical isolation of the one piece circuit board clamp and the circuit board.

7. An apparatus for stabilizing said circuit board as claimed in claim 1 wherein:
   a second threaded shaft is fastened to a cross member;
   said cross member includes at least one hole;
   said second threaded shaft is rigidly attached to said circuit board clamp; and
   said second threaded shaft is placed through said at least one hole of the cross member.

8. An apparatus for stabilizing said circuit board as claimed in claim 7 wherein said second threaded shaft is tightened to provide a stable connection between said circuit board clamp and said cross member.

9. An apparatus for stabilizing said circuit board as claimed in claim 7 wherein said cross member is attached to a first end of a chassis.

10. An apparatus for stabilizing said circuit board as claimed in claim 9 wherein said cross member is attached to the chassis with a fastener.

11. An apparatus for stabilizing said circuit board as claimed in claim 10 wherein said cross member is attached to a second end, opposite to the first end, of the chassis.

12. An apparatus for stabilizing said circuit board as claimed in claim 11 wherein there is further included:
   a plurality of circuit boards;
   each circuit board being attached to a respective one of a plurality of circuit board clamps; and each of said plurality of circuit board clamps being attached to said cross member.

13. An apparatus for stabilizing said circuit board as claimed in claim 12 wherein:

said cross member includes a plurality of holes;

said second threaded shaft is rigidly attached to said circuit board clamp; and said second threaded shaft of each of said plurality of circuit boards is placed through one of said plurality of holes of the cross member.

14. An apparatus for stabilizing said circuit board as claimed in claim 13 wherein said second threaded shaft is tightened on each of said plurality of circuit boards to provide a stable connection between said plurality of circuit boards and said cross member.

15. An apparatus for stabilizing said circuit board as claimed in claim 1 wherein said circuit board clamp includes separate circuit board clamp hooks, each of said separate circuit board clamp hooks are for attaching to an opposite side of said circuit board.

16. An apparatus to clamp said circuit board as claimed in claim 15 wherein said separate circuit board clamp hooks include:

a first hook and a second hook;

said first hook includes a threaded hole;

said second hook includes an unthreaded hole;

a threaded shaft mounted through said unthreaded hole and threaded through said threaded hole; and each of said separate circuit board clamp hooks tightly engage said opposite side of said circuit board when said threaded shaft is turned.

17. An apparatus to clamp said circuit board as claimed in claim 16 wherein said threaded shaft includes:

a slot on one end of the threaded shaft for tightening; and a cap on another end of the threaded shaft for tightening.

18. A method for rigidly stabilizing a circuit board consisting of the steps of:

clamping said circuit board with a single piece circuit board clamp including circuit board clamp hooks, said circuit board clamp hooks including first and second hooks;

providing said first hook with a threaded hole in a surface substantially parallel to said second hook;

inserting a threaded shaft through said threaded hole;

engaging tightly opposite sides of said circuit board by turning said threaded shaft;

fastening the circuit board clamp hooks to a cross member; and fastening said cross member to a chassis.

\* \* \* \* \*